US012460298B2

United States Patent
(12) United States Patent
Dhanakshirur et al.

(10) Patent No.: US 12,460,298 B2
(45) Date of Patent: Nov. 4, 2025

(54) SHOWERHEAD DESIGN TO CONTROL STRAY DEPOSITION

(71) Applicant: Applied Materials, Inc., Santa Clara, CA (US)

(72) Inventors: Akshay Dhanakshirur, Hubli (IN); Juan Carlos Rocha-Alvarez, San Carlos, CA (US); Kaushik Comandoor Alayavalli, Sunnyvale, CA (US); Jay D. Pinson, II, San Jose, CA (US); Rick Kustra, San Jose, CA (US); Badri N. Ramamurthi, Los Gatos, CA (US); Anup Kumar Singh, Santa Clara, CA (US); Ganesh Balasubramanian, Fremont, CA (US); Bhaskar Kumar, San Jose, CA (US); Vinayak Vishwanath Hassan, San Francisco, CA (US); Canfeng Lai, Fremont, CA (US); Kallol Bera, Fremont, CA (US); Sathya Swaroop Ganta, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 17/403,056

(22) Filed: Aug. 16, 2021

(65) Prior Publication Data

US 2022/0064797 A1 Mar. 3, 2022

(30) Foreign Application Priority Data

Sep. 2, 2020 (IN) ............................ 202041037913

(51) Int. Cl.
*C23C 16/455* (2006.01)
*C23C 16/505* (2006.01)
*H01J 37/32* (2006.01)

(52) U.S. Cl.
CPC .... *C23C 16/45565* (2013.01); *H01J 37/3244* (2013.01); *H01J 37/32522* (2013.01); *C23C 16/505* (2013.01); *H01J 2237/3321* (2013.01)

(58) Field of Classification Search
CPC ........... H01J 37/32082; H01J 37/32357; H01J 37/32431; H01J 37/3244; H01J 37/32449;
(Continued)

(56) References Cited

U.S. PATENT DOCUMENTS 6,051,286 A 4/2000 Zhao et al.
6,245,192 B1 * 6/2001 Dhindsa ........... C23C 16/45572 438/731
(Continued)

FOREIGN PATENT DOCUMENTS

CN 209929265 U 1/2020
JP 09316644 A 12/1997
WO 01-03163 A1 1/2001

OTHER PUBLICATIONS

International Search Report and Written Opinion dated Dec. 7, 2021 for Application No. PCT/US2021/046114.
(Continued)

*Primary Examiner* — Gordon Baldwin
*Assistant Examiner* — Joshua Reyes
(74) *Attorney, Agent, or Firm* — Patterson + Sheridan, LLP

(57) ABSTRACT

A lid for a process chamber includes a plate having a first surface and a second surface opposite the first surface. The first surface has a recess and a seal groove formed in the first surface and surrounding the recess. The lid further includes an array of holes extending from the recess to the second surface.

18 Claims, 7 Drawing Sheets

(58) Field of Classification Search
CPC ......... H01J 37/32633; H01J 2237/3321; H01J 37/32522; C23C 16/452; C23C 16/45563; C23C 16/45565; C23C 16/4557; C23C 16/45572; C23C 16/45578; C23C 16/4558; C23C 16/45587; C23C 16/45591; C23C 16/505; C23C 16/5096
See application file for complete search history.

(56) References Cited

U.S. PATENT DOCUMENTS

| | | | | |
|---|---|---|---|---|
| 7,210,424 | B2 | 5/2007 | Tolmachev et al. | |
| 7,780,789 | B2 | 8/2010 | Wu et al. | |
| 10,407,771 | B2 | 9/2019 | Cui et al. | |
| 2003/0124842 | A1* | 7/2003 | Hytros | C23C 16/45565 156/345.33 |
| 2005/0109460 | A1* | 5/2005 | DeDontney | C23C 16/45565 156/345.33 |
| 2006/0130756 | A1* | 6/2006 | Liang | C23C 16/507 118/715 |
| 2006/0196603 | A1* | 9/2006 | Lei | H01J 37/3244 156/345.33 |
| 2008/0078744 | A1 | 4/2008 | Wang et al. | |
| 2008/0102203 | A1 | 5/2008 | Wu et al. | |
| 2008/0121177 | A1* | 5/2008 | Bang | H01J 37/3244 257/E21.24 |
| 2008/0121179 | A1* | 5/2008 | Park | C23C 16/45591 118/723 R |
| 2008/0268173 | A1* | 10/2008 | White | H01J 37/3244 118/728 |
| 2009/0095424 | A1* | 4/2009 | Bettencourt | C23C 16/4401 156/345.34 |
| 2010/0140222 | A1 | 6/2010 | Sun et al. | |
| 2011/0162800 | A1* | 7/2011 | Noorbakhsh | H01J 37/32091 239/289 |
| 2016/0312360 | A1* | 10/2016 | Rasheed | C23C 16/4412 |
| 2017/0294325 | A1* | 10/2017 | Hunter | H01L 21/67017 |
| 2017/0335457 | A1* | 11/2017 | Nguyen | C23C 16/45512 |
| 2017/0338133 | A1* | 11/2017 | Tan | H01J 37/32513 |
| 2018/0230597 | A1 | 8/2018 | Ma et al. | |
| 2018/0230624 | A1* | 8/2018 | Dube | H01L 21/6719 |
| 2019/0043695 | A1* | 2/2019 | Wu | H01J 37/32091 |
| 2019/0043726 | A1* | 2/2019 | Yang | H01L 21/02164 |
| 2019/0097175 | A1* | 3/2019 | Wu | C23C 16/345 |
| 2019/0226087 | A1* | 7/2019 | Zhang | C23C 16/45559 |
| 2020/0030766 | A1 | 1/2020 | Lee et al. | |
| 2020/0224308 | A1 | 7/2020 | Jang et al. | |
| 2020/0370177 | A1 | 11/2020 | Franklin et al. | |

OTHER PUBLICATIONS

Office Action in related application TW 110130061 dated Mar. 13, 2025.

Taiwanese Office Action for Application No. 110130061 mailed Jul. 16, 2025.

* cited by examiner

SHOWERHEAD DESIGN TO CONTROL STRAY DEPOSITION

CROSS-REFERENCE TO RELATED APPLICATIONS

This application claims benefit of Indian Provisional Application No. 202041037913, filed Sep. 2, 2020, which is herein incorporated by reference in its entirety.

BACKGROUND

Field

Embodiments of the present disclosure generally relate to apparatus and methods utilized in the manufacture of semiconductor devices. More particularly, embodiments of the present disclosure relate to components of a substrate processing chamber for forming semiconductor devices.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, there is a trend to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are often utilized. As critical dimensions decrease, current hardmask materials lack the desired etch selectivity relative to underlying materials (e.g., oxides and nitrides) and are often difficult to deposit. Thus, what is needed in the art are improved methods and apparatus for fabricating semiconductor devices.

SUMMARY

The present disclosure generally relates to a lid for a process chamber that is used in the manufacture of semiconductor devices. In one embodiment, a lid for a process chamber includes a plate having a first surface and a second surface opposite the first surface. The first surface has a recess with an opening at the first surface. A seal groove is formed in the first surface and surrounds the opening. An array of holes extends from the recess to the second surface. The plate has an axis generally perpendicular to the first surface, and the opening extends radially from the axis 70% or less of a maximum lateral extent of the first surface from the axis.

In another embodiment, a lid for a process chamber includes a plate having a first surface and a second surface opposite the first surface. The plate has an axis generally perpendicular to the first surface and a seal groove formed in the first surface. The lid further includes a showerhead including an array of holes extending through the lid plate. Each hole of the array of holes extends from an entrance in the first surface to an exit in the second surface, the entrance located radially inward of the seal groove. The showerhead extends radially from the axis 80% or less of a maximum lateral extent of the second surface from the axis.

In another embodiment, an assembly includes a conduit configured to connect to a supply of a first gas and a lid. The lid includes a plate having a first surface connected to the conduit. A seal member seals an interface between the plate and the conduit. The plate has a second surface opposite the first surface, an axis generally perpendicular to the first surface, and a recess in the first surface. The recess is radially inward of the seal member, and is centered on the axis. The lid further includes a showerhead aligned with the recess and the conduit along the axis. The showerhead includes an array of holes extending through the lid plate from the recess to the second surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to a substrate processing chamber utilized in substrate processing in the manufacture of electronic devices. Substrate processing includes deposition processes, etch processes, as well as other low pressure processes, plasma processes, and thermal processes used to manufacture electronic devices on substrates. Examples of processing chambers and/or systems that may be adapted to benefit from exemplary aspects of the disclosure is the PIONEER™ PECVD system commercially available from Applied Materials, Inc., located in Santa Clara, California. It is contemplated that other processing chambers and/or processing platforms, including those from other manufacturers, may be adapted to benefit from aspects of the disclosure.

Figure 1:
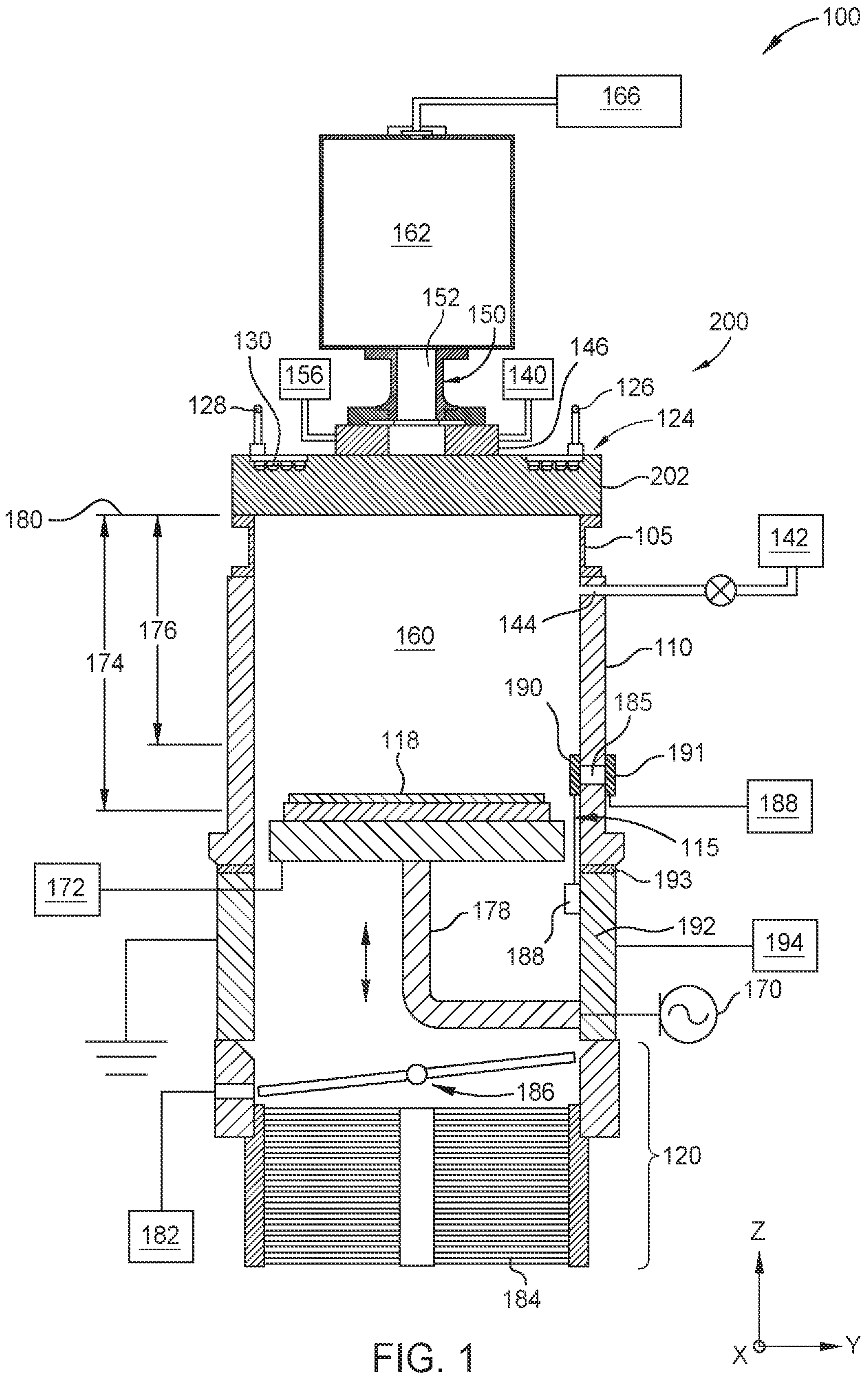
FIG. 1 is a schematic side cross sectional view of a processing chamber, according to one aspect of the disclosure.

FIG. 1 is a schematic side cross sectional view of an illustrative processing chamber 100 suitable for conducting a deposition process. In one embodiment, the processing chamber 100 may be configured to deposit advanced patterning films onto a substrate, such as hardmask films, for example amorphous carbon hardmask films. The processing chamber 100 includes a lid 200, a spacer 110 disposed on a chamber body 192, a substrate support 115, and a variable pressure system 120. A processing volume 160 exists inside the spacer 110 between the lid 200 and the substrate support 115.

The lid 200 is coupled to a first process gas source 140. The first process gas source 140 may contain a process gas, such as precursor gas for forming films on a substrate 118 supported on the substrate support 115. As an example, the precursor gas may include carbon-containing gas. As an example, the precursor gas may include hydrogen-containing gas. As an example, the precursor gas may include helium. As an example, the precursor gas may include one or more other gases. As an example, the precursor gas may include a combination of gases. In some embodiments, the precursor gas includes acetylene ($C_2H_2$).

A second process gas source 142 is fluidly coupled to the processing volume 160 via an inlet 144 disposed through the spacer 110. As an example, the second process gas source 142 may contain a process gas, such as precursor gas. As an example, the precursor gas may include carbon-containing gas. As an example, the precursor gas may include hydrogen-containing gas. As an example, the precursor gas may include helium. As an example, the precursor gas may include one or more other gases. As an example, the precursor gas may include a combination of gases. In some embodiments, the precursor gas includes $C_2H_2$.

In some embodiments, a total flow rate of precursor gas into the processing volume 160 may be about 100 sccm to about 2 slm. In some embodiments, a flow rate of precursor gas into the processing volume 160 from the second processing gas source 142 may modulate a flow rate of precursor gas into the processing volume 160 from the first processing gas source 140 such that the combined precursor gas is uniformly distributed in the processing volume 160. A plurality of inlets 144 are distributed circumferentially about the spacer 110. In one example, gas flow to each of the inlets 144 may be separately controlled to further facilitate the uniform distribution of precursor gas within the processing volume 160.

The lid 200 includes a plate 202. The plate 202 is coupled to the spacer 110 via a riser 105, but it is contemplated that the riser 105 may be omitted and the plate 202 may be directly coupled to the spacer 110. In some embodiments, which may be combined with other embodiments, the riser 105 may be integrated with the plate 202. The lid 200 includes a heat exchanger 124. The heat exchanger 124 may be attached to the plate 202 or integrated with the plate 202. The heat exchanger 124 includes an inlet 126 and an outlet 128. In embodiments in which the heat exchanger 124 is integrated with the plate 202, heat exchange fluids may flow from the inlet 126, through channels 130 formed in the plate 202, and out of the outlet 128.

The plate 202 is coupled to or integrated with a manifold 146. The plate 202 is coupled to a remote plasma source 162 by a conduit 150, such as a mixing ampoule, having an axial throughbore 152 to facilitate flow of plasma through the conduit 150. Although the conduit 150 is illustrated as coupled to the manifold 146, it is contemplated that the manifold 146 may be integrated with the conduit 150 such that the conduit 150 may be directly coupled to the plate 202. The manifold 146 is coupled to the first process gas source 140 and a purge gas source 156. Both of the first process gas source 140 and the purge gas source 156 may be coupled to the manifold 146 by valves (not shown).

Although the lid 200 may be coupled to a remote plasma source 162, in some embodiments, the remote plasma source 162 may be omitted. When present, the remote plasma source 162 may be coupled to a cleaning gas source 166 via a feed line for providing cleaning gas to the processing volume 160. When the remote plasma source 162 is absent, the cleaning gas source 166 may be directly coupled to the conduit 150. When the remote plasma source 162 is absent, the cleaning gas source 166 may be indirectly coupled to the conduit 150. Cleaning gas may be provided through the conduit 150. Additionally, or alternatively, in some embodiments, cleaning gas is provided through a channel that also conveys precursor gas into the processing volume 160. As an example, the cleaning gas may include an oxygen-containing gas, such as molecular oxygen ($O_2$) and/or ozone ($O_3$). As an example, the cleaning gas may include a fluorine-containing gas, such as $NF_3$. As an example, the cleaning gas may include one or more other gases. As an example, the cleaning gas may include a combination of gases.

The substrate support 115 is coupled to a RF power source 170. The RF power source 170 may be a low frequency RF power source (for example, about 2 MHz to about 13.56 MHz). It is to be noted that other frequencies are also contemplated. In some implementations, the RF power source 170 is a mixed frequency RF power source, providing both high frequency and low frequency power. Utilization of a dual frequency RF power source, improves film deposition. In one example, utilizing a RF power source 170 provides dual frequency powers. A first frequency of about 2 MHz to about 13.56 MHz improves implantation of chemical species into the deposited film, while a second frequency of about 13.56 MHz to about 120 MHz increases ionization and deposition rate of the film.

The RF power source 170 may be utilized in creating or maintaining a plasma in the processing volume 160. For example, the RF power source 170 may be utilized during a deposition process. During a deposition or etch process, the RF power source 170 provides a power of about 100 Watts (W) to about 20,000 W in the processing volume 160 to facilitate ionization of a precursor gas. In one embodiment, which can be combined with other embodiments described herein, the RF power source 170 is pulsed. In another embodiment, which can be combined with other embodiments described herein, the precursor gas includes helium and $C_2H_2$. In one embodiment, which can be combined with other embodiments described herein, $C_2H_2$ is provided at a flow rate of about 10 sccm to about 1,000 sccm and helium is provided at a flow rate of about 50 sccm to about 10,000 sccm.

The substrate support 115 is coupled to an actuator 172 (i.e., a lift actuator) that provides movement thereof in the Z direction. The substrate support 115 is also coupled to a facilities cable 178 that is flexible which allows vertical movement of the substrate support 115 while maintaining communication with the second RF power source 170 as well as other power and fluid connections. The spacer 110 is disposed on the chamber body 192. A height of the spacer 110 allows movement of the substrate support 115 vertically within the processing volume 160. The height of the spacer 110 may be from about 0.5 inches to about 20 inches, such as about 3 inches to about 20 inches, such as about 5 inches to about 15 inches, such as about 7 inches to about 10 inches. In one example, the substrate support 115 is movable from a first distance 174 to a second distance 176 relative to the lid 200 (for example, relative to a datum 180 of the plate 202). In one embodiment which may be combined with other embodiments, the second distance 176 is about two-thirds of the first distance 174. For example, the difference between the first distance 174 and the second distance may be about 5 inches to about 6 inches. Thus, from the position shown in FIG. 1, the substrate support 115 is movable by about 5 inches to about 6 inches relative to a datum 180 of the plate 202. In another example, the substrate support 115 is fixed at one of the first distance 174 and the second distance 176.

In contrast to conventional plasma enhanced chemical vapor deposition (PECVD) processes, the spacer 110 greatly increases the distance between (and thus the volume between) the substrate support 115 and the lid 200. The increased distance between the substrate support 115 and the lid 200 reduces collisions of ionized species in the process volume 160, resulting in deposition of film with less neutral stress, such as less than 2.5 gigapascal (GPa). Films deposited with less neutral stress facilitate improved planarity (e.g., less bowing) of substrates upon which the film is formed. Reduced bowing of substrates results in improved precision of downstream patterning operations.

The variable pressure system 120 includes a first pump 182 and a second pump 184. The first pump 182 is a roughing pump that may be utilized during a cleaning process and/or substrate transfer process. A roughing pump is generally configured for moving higher volumetric flow rates and/or operating a relatively higher (though still sub-atmospheric) pressure. In one example, the first pump 182 maintains a pressure within the processing chamber 100 less than 50 mTorr during a cleaning process. In another example, the first pump 182 maintains a pressure within the processing chamber 100 of about 0.5 mTorr to about 10 Torr. Utilization of a roughing pump during cleaning operations facilitates relatively higher pressures and/or volumetric flow of cleaning gas (as compared to a deposition operation). The relatively higher pressure and/or volumetric flow during the cleaning operation improves cleaning of chamber surfaces.

The second pump 184 may be a turbo pump or a cryogenic pump. The second pump 184 is utilized during a deposition process. The second pump 184 is generally configured to operate a relatively lower volumetric flow rate and/or pressure. For example, the second pump 184 is configured to maintain the processing volume 160 of the process chamber at a pressure of less than about 50 mTorr. In another example, the second pump 184 maintains a pressure within the processing chamber of about 0.5 mTorr to about 10 Torr. The reduced pressure of the processing volume 160 maintained during deposition facilitates deposition of a film having reduced neutral stress and/or increased $sp^2$-$sp^3$ conversion, when depositing carbon-based hardmasks. Thus, process chamber 100 is configured to utilize both relatively lower pressure to improve deposition and relatively higher pressure to improve cleaning.

In some embodiments, which can be combined with other embodiments described herein, both of the first pump 182 and the second pump 184 are utilized during a deposition process to maintain the processing volume 160 of the process chamber at a pressure of less than about 50 mTorr. In other embodiments, the first pump 182 and the second pump 184 maintain the processing volume 160 at a pressure of about 0.5 mTorr to about 10 Torr. A valve 186 is utilized to control a conductance path to one or both of the first pump 182 and the second pump 184. The valve 186 also provides for symmetrical pumping from the processing volume 160.

The processing chamber 100 also includes a substrate transfer port 185. The substrate transfer port 185 is selectively sealed by an interior door 190 and/or an exterior door 191. Each of the doors 190 and 191 are coupled to actuators 188 (i.e., a door actuator). The doors 190 and 191 facilitate vacuum sealing of the processing volume 160. The doors 190 and 191 also provide symmetrical RF application and/or plasma symmetry within the processing volume 160. In one example, at least the interior door 190 is formed of a material that facilitates conductance of RF power, such as stainless steel, aluminum, or alloys thereof. Seals 193, such as O-rings, disposed at the interface of the spacer 110 and the chamber body 192 further seal the processing volume 160. A controller 194 is configured to control aspects of the processing chamber 100 during processing.

Figure 2A:
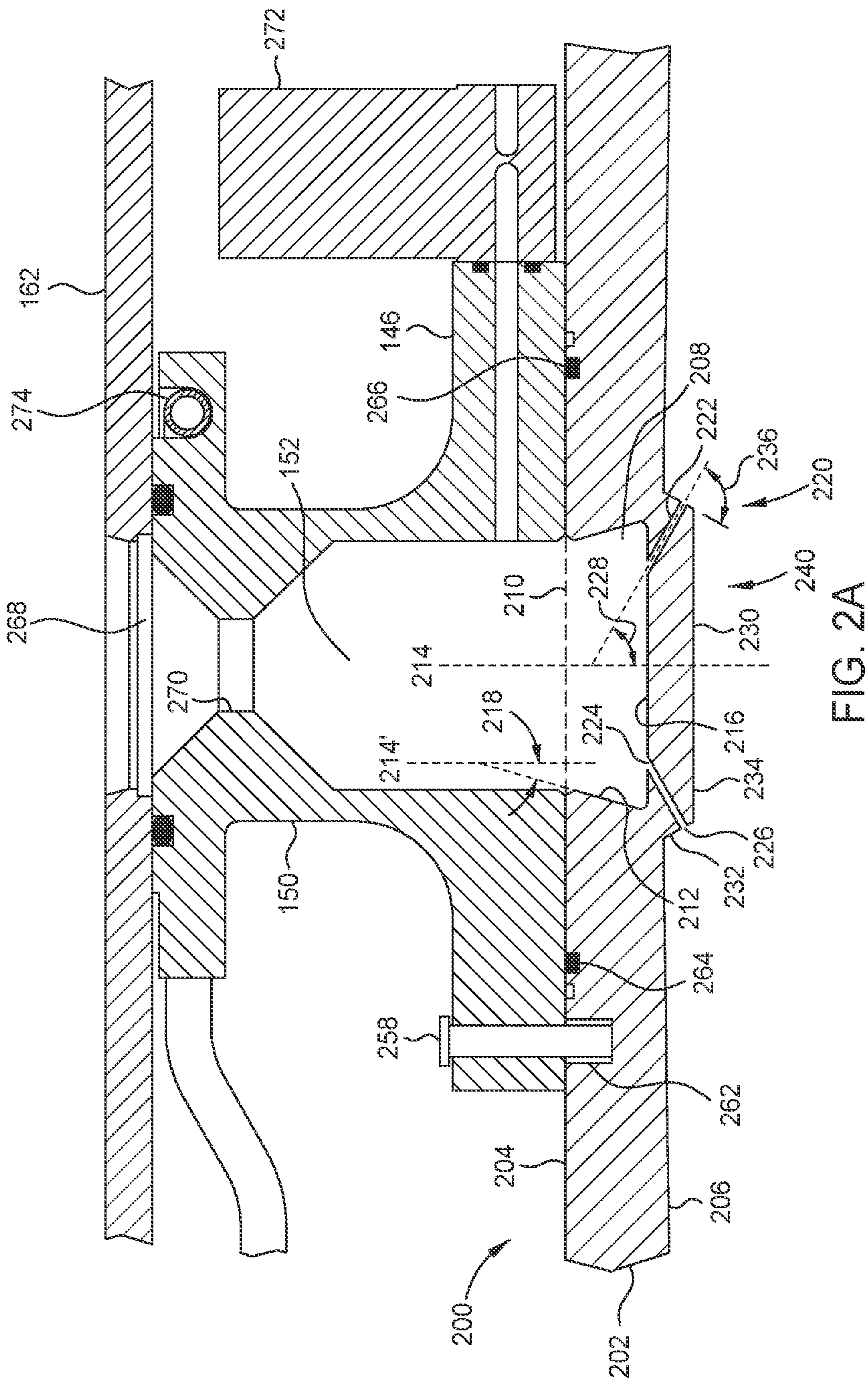
FIG. 2A is a schematic side cross sectional view of a portion of a lid coupled to a conduit, according to one aspect of the disclosure.

FIG. 2A is a cross section partial view of a lid 200 of some embodiments. As shown in FIG. 2A, the baffle 158 may be omitted. The lid 200 includes a plate 202. The plate 202 has a first, or upper, surface 204 and a second, or lower, surface 206 opposite the upper surface 204. In some embodiments, the lower surface 206 of the plate 202 may be shaped or contoured. The plate 202 may have a recess 208 in the upper surface 204. The recess 208 has an opening 210 and a sidewall 212 extending from the opening 210 to a floor 216 within the plate 202. In some embodiments, the opening 210 defines a circle. For the purpose of the following geometrical description, the plate 202 may have an axis 214 that is generally perpendicular to the upper surface 204 and thus extends between the upper surface 204 and the lower surface 206. It is contemplated that the opening 210 may radially extend from the axis 214 to a location that is 95% or less of a maximum lateral extent of the upper surface 204 of plate 202 from the axis 214. For example, the opening 210 may radially extend from the axis 214 to a location that is 90% or less, 80% or less, 70% or less, 60% or less, 50% or less, 40% or less, 30% or less, 20% or less, 10% or less, or 5% or less of a maximum lateral extent of the upper surface 204 of plate 202 from the axis 214.

As shown in FIG. 2A, the sidewall 212 extends from the opening 210 to the floor 216 at an acute angle 218 to datum line 214' which is parallel to the axis 214. Thus, the sidewall 212 extends from the opening 210 to the floor 216 at an acute angle 218 to the axis 214. However, it is contemplated that the sidewall 212 may extend from the opening 210 to the floor 216 substantially parallel to the axis 214. The acute angle 218 may be between zero and 80 degrees, such as between zero and 70 degrees, such as between zero and 60 degrees, such as between zero and 50 degrees, such as between zero and 40 degrees, such as zero and 30 degrees, such as between zero and 20 degrees, such as between zero and 10 degrees. In some embodiments, as shown in FIG. 2A, the sidewall 212 may extend from the opening 210 to the floor 216 such that a cross sectional area of the opening 210 is less than a cross sectional area of the floor 216, defining a frustoconical shape.

An array 220 of holes 222 extends from the recess 208 through the plate 202 to the lower surface 206. Each hole 222 extends from a corresponding entrance 224 at the recess 208 to a corresponding exit 226 at the lower surface 206. Each entrance 224 is located at the floor 216 of the recess 208. However, it is contemplated that each entrance 224 may be located at the sidewall 212 of the recess 208, or that each entrance 224 may be located at an intersection of the sidewall 212 and the floor 216 of the recess 208. In some embodiments, which may be combined with other embodiments, an entrance 224 of one or more hole 222 of the array 220 of holes 222 may be located at one of the floor 216, the sidewall 212, and the intersection of the floor 216 and the sidewall 212, and an entrance 224 of one or more other hole 222 of the array 220 of holes 222 may be located at another of the floor 216, the sidewall 212, and the intersection of the floor 216 and the sidewall 212. In other words, array 220 has a plurality of holes 222 each having an entrance 224, where the entrances 224 are independently located at one of the floor 216, the sidewall 212, or the intersection of the floor 216 and the sidewall 212.

As shown in FIG. 2A, each hole 222 has a trajectory that extends through the plate 202 at an acute angle 228 to the axis 214. The acute angle 228 is between zero and 80 degrees, such as between zero and 70 degrees, such as between zero and 60 degrees, such as between zero and 50 degrees, such as between zero and 40 degrees, such as between zero and 30 degrees, such as between zero and 20 degrees, such as between zero and 10 degrees. However, it is contemplated that at least one hole 222 may have a trajectory that is parallel to the axis 214. It is further contemplated that each hole 222 may have a trajectory that is parallel to the axis 214.

As shown in FIG. 2A, the lower surface 206 includes a protrusion 230. In some embodiments, which may be combined with other embodiments, each exit 226 may be located at the protrusion 230. However other configurations are contemplated. For example, each exit 226 may not be located at the protrusion 230, or each exit 226 may be located at a base of the protrusion 230. In some embodiments, which may be combined with other embodiments, an exit 226 of one or more hole 222 of the array 220 of holes 222 may be located at one of the protrusion 230, the base of the protrusion 230, and a portion of the lower surface 206 away from the protrusion 230, and an exit 226 of one or more other hole 222 of the array 220 of holes 222 may be located at another of the protrusion 230, the base of the protrusion 230, and a portion of the lower surface 206 away from the protrusion 230. In other words, the array 220 has a plurality of holes 222 each having an exit 226, where each exit 226 is independently located at the protrusion 230, the base of the protrusion 230, or a portion of the second surface 206 away from the protrusion 230.

The protrusion 230 is frustoconical in shape having a side face 232 and an end face 234, but other configurations are contemplated. In some embodiments, the protrusion 230 may be shaped like a portion of a sphere, an ellipsoid, or a cylinder. In some embodiments, which may be combined with other embodiments, each exit 226 may be located at the side face 232, or each exit 226 may be located at the end face 234, or, each exit 226 may be located at an intersection of the side face 232 and the end face 234. In some embodiments, which may be combined with other embodiments, an exit 226 of one or more hole 222 of the array 220 of holes 222 may be located at one of the side face 232, the end face 234, and the intersection of the side face 232 and the end face 234, and an exit 226 of one or more other hole 222 of the array 220 of holes 222 may be located at another of the side face 232, the end face 234, and the intersection of the side face 232 and the end face 234. In other words, array 220 has a plurality of holes 222 each having an exit 226 that is independently located at one of the side face 232, the end face 234, or the intersection of the side face 232 and the end face 234. In some embodiments, which may be combined with other embodiments, an angle 236 at which the trajectory of each hole 222 whose exit 226 is located at the side face 232 intersects the side face 232 may be substantially 90 degrees.

The plate 202 includes a centrally located showerhead 240, which includes the protrusion 230 (when present) and the array 220 of holes 222. As shown in FIG. 2A, the showerhead 240 is integral with the plate 202. However, it is contemplated that the showerhead 240 may be permanently attached to the plate 202 or removably attached to the plate 202. The arrangement of the showerhead 240 and the plate 202, particularly in embodiments in which the showerhead 240 is integral with the plate 202, may facilitate the entire enclosure of processing volume 160 (including plate 202, riser 105 (when present), and spacer 110) being fully grounded during use, thereby inhibiting the generation of parasitic plasma.

The array 220 of holes 222 may be arranged as a single ring of holes 222 or into multiple rings of holes 222. The holes 222 of the array 220 of holes 222 can be arranged at a substantially uniform spacing in a ring. The holes 222 of the array 220 of holes 222 can be arranged at a non-uniform spacing in a ring. When utilizing the multiple rings of holes 222, the multiple rings of holes 222 may be concentric, non-concentric, or arranged as clusters. In some embodiments, which may be combined with other embodiments, some rings of the multiple rings of holes 222 may be arranged as one of concentric, non-concentric, and clustered, and other rings of the multiple rings of holes 222 may be arranged as another of concentric, non-concentric, and clustered.

Other arrangements of the holes 222 are also contemplated. For example, at least some of the holes 222 of the array 220 of holes 222 may be arranged into other geometric patterns, such as a line, a triangle, a quadrilateral, a pentagon, a hexagon, and the like. Additionally, or alternatively, at least some holes 222 of the array 220 of holes 222 may be arranged as a cluster of holes 222 defining a regular pattern, such as a pattern displaying one or more uniform spacing dimension between pairs of adjacent holes 222. Additionally, or alternatively, at least some holes 222 of the array 220 of holes 222 may be arranged as a cluster of holes 222 defining an irregular pattern, such as a pattern displaying non-uniform spacing dimensions between pairs of adjacent holes 222.

Figure 2B:
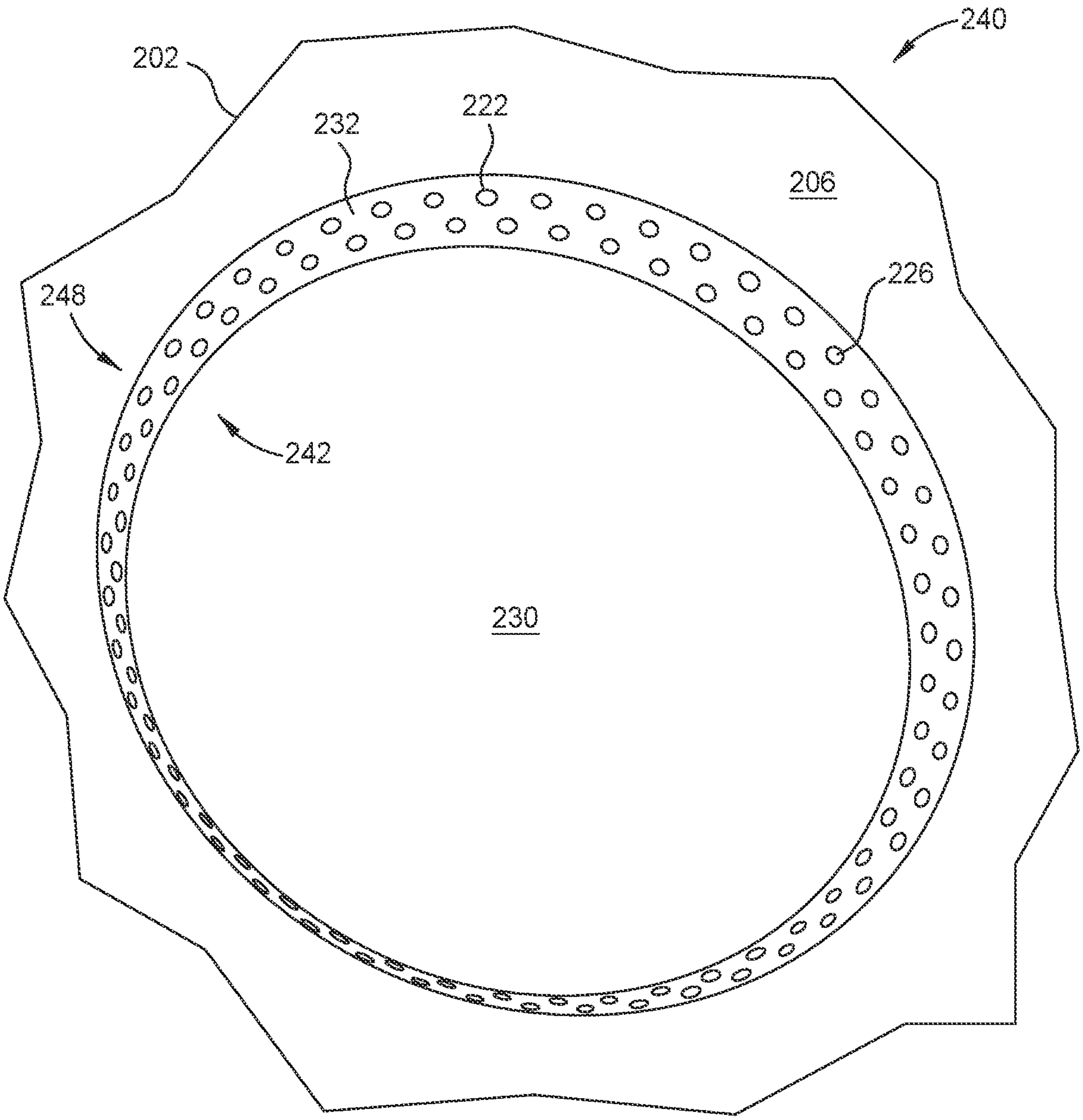
FIG. 2B is a perspective view of a showerhead of the lid of FIG. 2A.
Figure 2C:
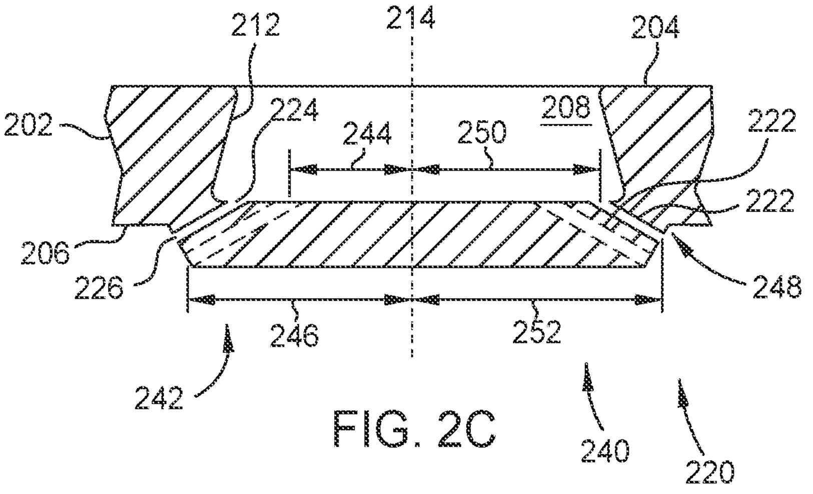
FIG. 2C is a schematic side cross sectional view of the showerhead of FIGS. 2A and 2B.
Figure 2D:
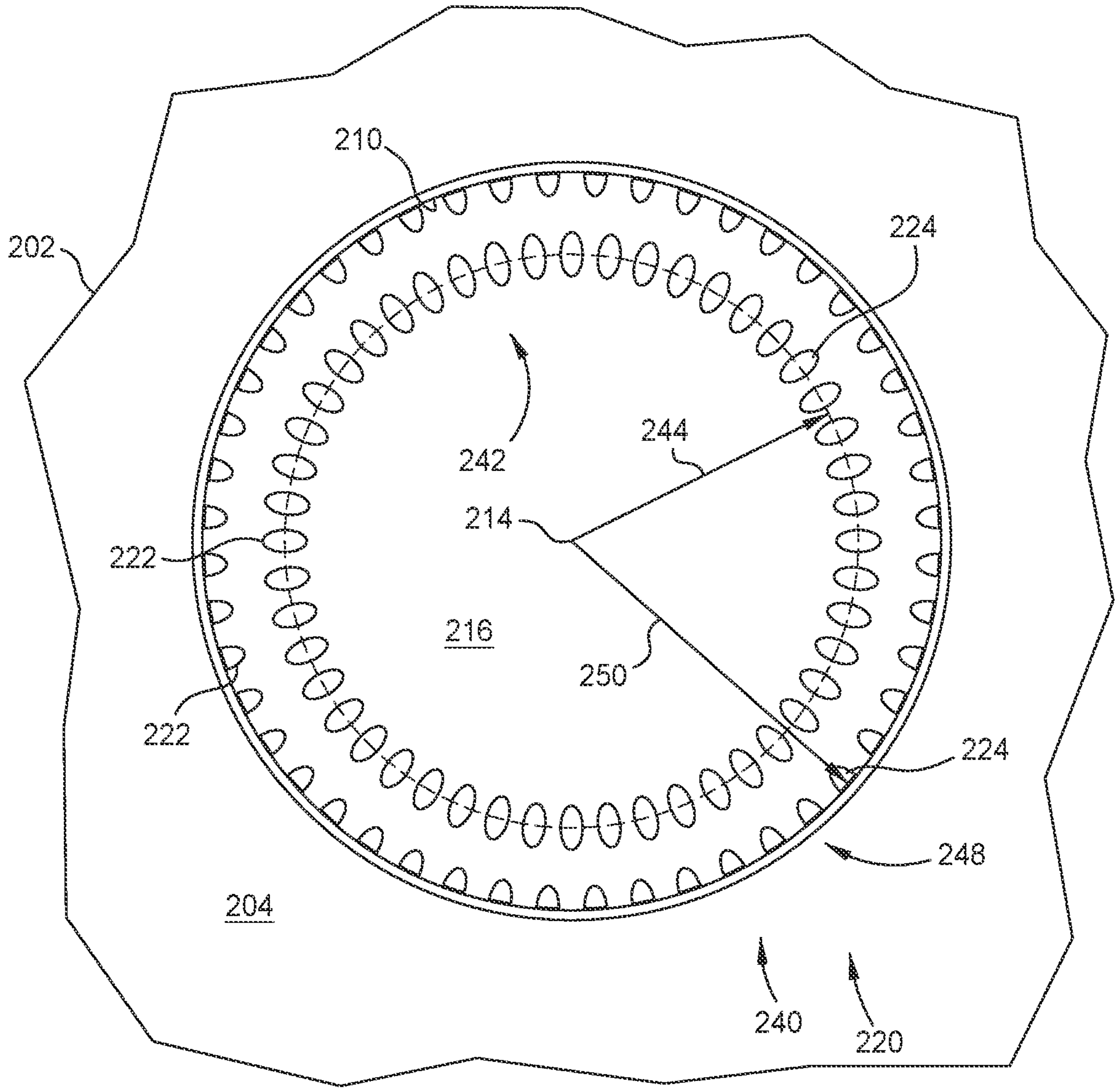
FIG. 2D is a plan view of a portion of the lid of FIGS. 2A to 2C.

As shown in FIGS. 2B-2D, the array 220 of holes 222 is arranged as two rings of holes 222, a first ring 242 and a second ring 248. As shown in FIGS. 2C and 2D, the first ring 242 and second ring 248 are concentric, and centered on the axis 214. The first ring 242 has a first ring entrance radius 244 measured from the axis 214 to a center of the entrance 224 of each hole 222 of the first ring 242. The second ring 248 has a second ring entrance radius 250 measured from the axis 214 to a center of the entrance 224 of each hole 222 of the second ring 248. As shown in FIGS. 2C and 2D, the second ring 248 entrance radius 250 is greater than the first ring entrance radius 244. The first ring 242 has a first ring exit radius 246 measured from the axis 214 to a center of the exit 226 of each hole 222 of the first ring 242. The second ring 248 has a second ring exit radius 252 measured from the axis 214 to a center of the exit 226 of each hole 222 of the second ring 248. As shown in FIG. 2D, the second ring exit radius 252 may be greater than the first ring exit radius 246.

In some embodiments, which may be combined with other embodiments, the angle 228 of the trajectory of each hole 222 of the array 220 of holes 222 may be substantially the same, for example, within 1 degree of one another. However, it is contemplated, the angle 228 of the trajectory of some holes 222 of the array 220 of holes 222 may differ from the angle 228 of the trajectory of other holes 222 of the array 220 of holes 222. For example, the first ring entrance radius 244 may be greater than or equal to the second ring entrance radius 250, and the first ring exit radius 246 may be less than the second ring exit radius 252.

A diameter of each hole 222 of the array 220 of holes 222 may be substantially the same as the diameter of each other hole 222, as determined by standard manufacturing tolerances. However, it is contemplated that the diameter of some holes 222 of the array 220 of holes 222 may differ from the diameter of other holes 222 of the array 220 of holes 222. For example, holes 222 having a first diameter may be arranged into a first cluster or geometric shape or pattern, and holes 222 having a second diameter different from the first diameter may be arranged into a second cluster or geometric shape or pattern. In such examples, the first cluster or geometric shape or pattern may have a size, shape, and/or pattern similar to a size, shape, and/or pattern of the second cluster or geometric shape or pattern. Additionally, or alternatively, the first cluster or geometric shape or pattern may have a size, shape, and/or pattern different from a size, shape, and/or pattern of the second cluster or geometric shape or pattern.

In some embodiments, which may be combined with other embodiments, the diameter of each hole 222 of the array 220 of holes 222 may be substantially uniform. In some embodiments, the diameter of each hole 222 of the array 220 of holes 222 may be substantially non-uniform. For example, the diameter of each hole 222 may taper from a larger diameter at each entrance 224 to a smaller diameter at each exit 226. Alternatively, the diameter of each hole 222 may taper from a smaller diameter at each entrance 224 to a larger diameter at each exit 226. Alternatively, the diameter of each hole 222 may be uniform along part of the length of each hole 222, and may transition to a different diameter such that the diameter of each hole 222 at the entrance 224 may be greater than or less than the diameter of each hole 222 at the exit 226. In some embodiments, which may be combined with other embodiments, the diameter of some holes 222 of the array 220 of holes 222 may be substantially uniform, and the diameter of other holes 222 of the array 220 of holes 222 may be substantially non-uniform.

The sizing of each hole 222 of the array 220 of holes 222 may be selected by determining any one or more of a hole 222 length, a hole 222 diameter, a variation of hole 222 diameter along the hole 222 length, or a trajectory of each hole 222. In some embodiments, which may be combined with other embodiments, the number and/or sizing of the holes 222 of the array 220 of holes 222 may be selected according to one or more predetermined operational parameters or constraints. For example, the number and/or sizing of the holes 222 of the array 220 of holes 222 may be selected according to one or more ranges of values of one or more predetermined operational parameters or constraints. Example operational parameters and constraints may include, without limitation, any one or more of a sheath thickness of plasma created during operation, a pressure of gas at the entrance 224 of each hole 222, a pressure of gas at the exit 226 of each hole 222, an average velocity of gas through each hole 222, a velocity of gas within each hole 222 at the entrance 224 of each hole 222, a velocity of gas within each hole 222 at the exit 226 of each hole 222, a total volumetric flow rate of gas through the holes 222, a total volumetric flow rate of gas through a group of holes 222 of the array 220 of holes 222, and the like.

The number of holes 222 and/or sizing of the holes 222 of the array 220 of holes 222 may be selected according to a pressure of gas at the entrance 224 of each hole 222 being about 0.01 Torr to about 10 Torr, such as about 0.01 Torr to about 5 Torr, such as about 0.01 Torr to about 3 Torr, such as about 0.1 Torr to about 3 Torr, such as about 1 Torr to about 3 Torr.

The number of holes 222 and/or sizing of the holes 222 of the array 220 of holes 222 may be selected according to a pressure of gas at the exit 226 of each hole 222 being about 1 mTorr to about 1 Torr, such as about 1 mTorr to about 0.5 Torr, such as about 1 mTorr to about 0.1 Torr, such as about 1 mTorr to about 50 mTorr, such as about 1 mTorr to about 20 mTorr.

It is further contemplated that the number of holes 222 of the array 220 of holes 222 may be selected according to one or more predetermined operational parameters or constraints, and the sizing of the holes 222 may be selected according to one or more other predetermined operational parameters or constraints. For example, a diameter of each hole 222 may be selected according to any one or more of a sheath thickness of plasma created during operation, a pressure of gas at the entrance 224 of each hole 222, a pressure of gas at the exit 226 of each hole 222, an average velocity of gas through each hole 222, a velocity of gas within each hole 222 at the entrance 224 of each hole 222, a velocity of gas within each hole 222 at the exit 226 of each hole 222, and the like; and the number of holes 222 of the array 220 of holes 222 may be selected according to another of any one or more of a pressure of gas at the entrance 224 of each hole 222, a pressure of gas at the exit 226 of each hole 222, an average velocity of gas through each hole 222, a velocity of gas within each hole 222 at the entrance 224 of each hole 222, a velocity of gas within each hole 222 at the exit 226 of each hole 222, a total volumetric flow rate of gas through the holes 222, a total volumetric flow rate of gas through a group of holes 222 of the array 220 of holes 222, and the like.

In some embodiments, which may be combined with other embodiments, each hole 222 of the array 220 of holes 222 may be sized to have a diameter no greater than five times a sheath thickness of plasma created during operation, such as no greater than four times a sheath thickness of plasma created during operation, such as no greater than three times a sheath thickness of plasma created during operation, such as no greater than two times a sheath thickness of plasma created during operation, such as no greater than a sheath thickness of plasma created during operation.

It is further contemplated that the number and/or diameter of holes 222 of the array 220 of holes 222 may be selected such that a velocity of gas within each hole 222 at the exit 226 of each hole 222 is less than Mach 1 but greater than or equal to a half of Mach 1. It is further contemplated that the number and/or diameter of holes 222 of the array 220 of holes 222 may be selected such that a velocity of gas within each hole 222 at the exit 226 of each hole 222 is substantially equal to Mach 1. It is further contemplated that the number and/or diameter of holes 222 of the array 220 of holes 222 may be selected such that a velocity of gas within each hole 222 at the exit 226 of each hole 222 is greater than Mach 1 but no greater than Mach 2.

It is further contemplated that the number and/or diameter of holes 222 of the array 220 of holes 222 may be selected such that a velocity of gas within each hole 222 at the entrance 224 of each hole 222 is less than Mach 1. It is further contemplated that the number and/or diameter of holes 222 of the array 220 of holes 222 may be selected such that a velocity of gas within each hole 222 at the entrance 224 of each hole 222 is substantially equal to Mach 1. It is further contemplated that the number and/or diameter of holes 222 of the array 220 of holes 222 may be selected such that a velocity of gas within each hole 222 at the entrance 224 of each hole 222 is greater than Mach 1 but no greater than Mach 2.

As shown in FIG. 2C, the showerhead extends radially from the axis 214 to the exit 226 of the outer ring of holes 222, which is a radius equivalent to the second ring exit radius 252. It is contemplated that the showerhead 240 may radially extend from the axis 214 to a location that is 95% or less of a maximum lateral extent of the lower surface 206 of plate 202 from the axis 214. For example, the showerhead 240 may radially extend from the axis 214 to a location that is 90% or less, 80% or less, 70% or less, 60% or less, 50% or less, 40% or less, 30% or less, 20% or less, 10% or less, or 5% or less of a maximum lateral extent of the lower surface 206 of plate 202 from the axis 214.

Returning to FIG. 2A, FIG. 2A shows part of an assembly including plate 202 of lid 200. A conduit 150 is attached to the upper surface 204 of plate 202. The conduit 150 has a throughbore 152 that is substantially aligned with the recess 208. The conduit 150 is attached to the upper surface 204 of the plate 202 by one or more fasteners 258. As illustrated, the upper surface 204 of the plate 202 includes one or more openings 262 for receiving corresponding fasteners 258, such as bolts, screws, studs, dowel pins, or the like. Additionally, or alternatively, it is contemplated that the upper surface 204 may include one or more projections for connecting the plate 202 to the conduit 150, and the projections may be threaded. A seal groove 264 in the upper surface 204 of the plate 202 is located between the one or more fasteners 258 and the recess 208, and surrounds the opening 210 to the recess 208. It is contemplated that where multiple fasteners 258 are utilized, the fasteners 258 surround the seal groove 264. As shown in FIG. 2A, a seal member 266, such as an O-ring, is installed in the seal groove 264, thereby sealing an interface between the plate 202 and the conduit 150. It is contemplated that the seal member 266 may contact a portion of the conduit 150 or a flange or other structure associated with the conduit 150, such as manifold 146.

The conduit 150 is shown coupled to a remote plasma source 162, part of which is shown in FIG. 2A. The throughbore 152 may be substantially aligned with an outlet 268 of the remote plasma source 162. It is contemplated that the throughbore 152 may have a substantially uniform inner diameter along a length of the conduit 150 from the outlet 268 of the remote plasma source 162 to the upper surface 204 of the plate 202, however, as shown in the example of FIG. 2A, the throughbore 152 may include a restriction 270 part-way along the length of the conduit 150 from the outlet 268 of the remote plasma source 162 to the upper surface 204 of the plate 202.

As shown in FIG. 2A, the conduit 150 incorporates a manifold 146. The manifold 146 is coupled to the first process gas source 140 via a valve 272. In some embodiments, the manifold 146 may provide a single point of entry of process gas into the conduit 150, however it is contemplated that the manifold 146 may provide multiple points of entry of process gas into the conduit 150. In some embodiments, the manifold 146 may be coupled to the purge gas source 156, however it is contemplated that the conduit 150 may be coupled to the purge gas source 156 at a location of the conduit 150 other than at the manifold 146. For example, the conduit 150 may be coupled to the purge gas source 156 at a location at or near an upper end of the conduit 150. As shown in FIG. 2A, the conduit 150 includes a heat exchanger 274, such as a tube configured to convey heat exchange fluid. It is contemplated, however, that the heat exchanger 274 may be omitted.

In operation, purge gas from the purge gas source 156 enters the conduit 150 and becomes mixed with gas from the first process gas source 140. The combined gases flow out of the conduit 150 and through the holes 222 in the plate 202 into the processing volume 160. A cleaning cycle of operation involves cleaning gas flowing through the conduit 150 and through the holes 222 in the plate 202 into the processing volume 160. It is contemplated that the cleaning gas may become mixed with the purge gas in the conduit 150 before the combined gases flow through the holes 222 in the plate 202 into the processing volume 160. It is further contemplated that plasma from the remote plasma source 162 enters the conduit 150 and becomes mixed with the purge gas in the conduit 150 before the combined plasma and gas flow through the holes 222 in the plate 202 into the processing volume 160.

Figure 3A:
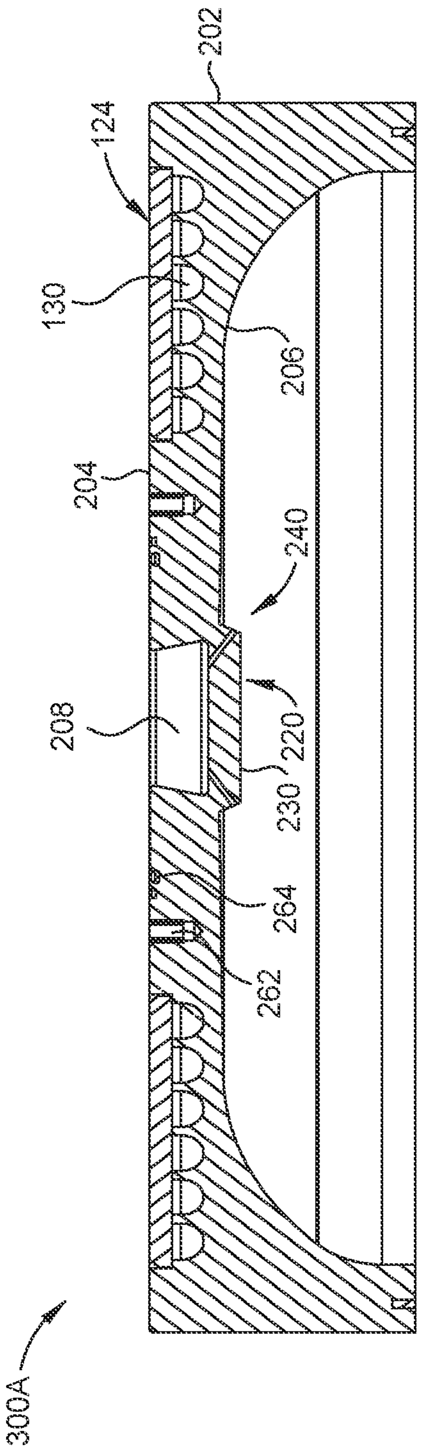
FIGS. 3A to 3D are schematic side cross sectional views of alternative embodiments of the lid of FIGS. 2A to 2D.

FIG. 3A shows an embodiment of a lid 300A. The lid 300A is similar to the lid 200 of FIG. 2A, and may be used in place thereof. The lid 300A incorporates the one or more openings 262, seal groove 264, recess 208, protrusion 230, and showerhead 240 of lid 200. As illustrated, lid 300A includes a heat exchanger 124 that includes channels 130 formed in the plate 202. The showerhead 240, protrusion 230, and channels 130 are integrated with the plate 202 such that the plate 202 with the showerhead 240, protrusion 230, and the channels 130 is a monolithic, or unitary, structure. As shown, the lower surface 206 of the plate 202 is shaped or contoured as an interior of a dome.

As a further alternative, it is contemplated that the recess 208 of lid 300A be omitted such that the upper surface 204 of the plate 202 includes the entrance 224 of each hole 222 of the array 220 of holes 222, and the entrances 224 are surrounded by the seal groove 264. In such an example, the trajectory of each hole 222 and/or the geometry of the protrusion 230 may be arranged to account for the geometry of the plate 202 whereby the recess 208 is absent.

Figure 3B:
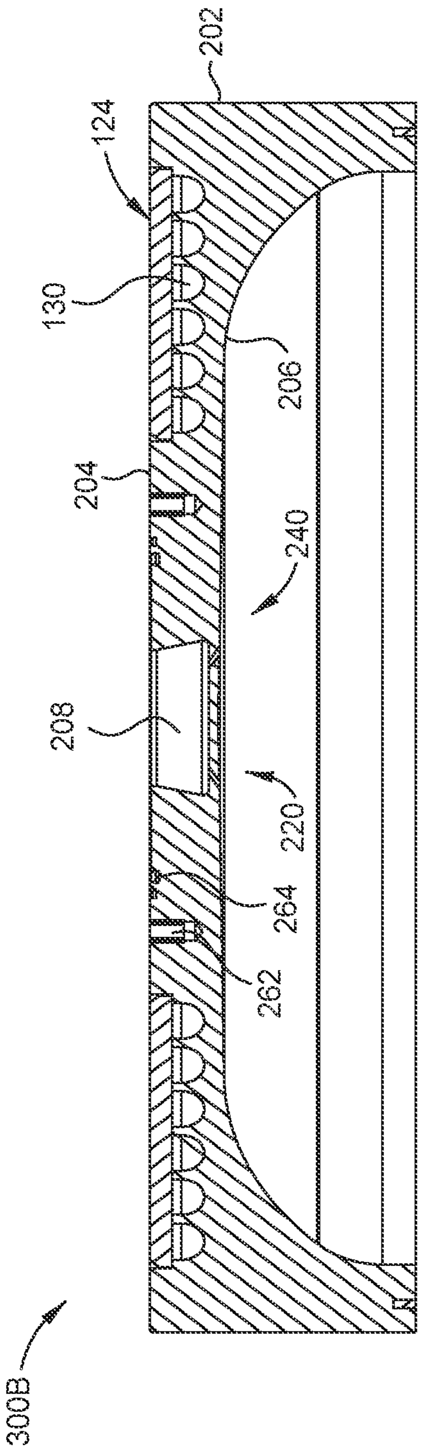

FIG. 3B shows an embodiment of a lid 300B. The lid 300B is similar to the lid 200 of FIG. 2A, and may be used in place thereof. The lid 300B incorporates the one or more openings 262, seal groove 264, recess 208, and showerhead 240 of lid 200. As illustrated, the lid 300B omits the protrusion 230, but includes a heat exchanger 124 that includes channels 130 formed in the plate 202. The showerhead 240 and channels 130 are integrated with the plate 202 such that the plate 202 with the showerhead 240 and the channels 130 is a monolithic, or unitary, structure. As shown, the lower surface 206 of the plate 202 is shaped or contoured as an interior of a dome.

As a further alternative, it is contemplated that the recess 208 of lid 300B be omitted such that the upper surface 204 of the plate 202 includes the entrance 224 of each hole 222 of the array 220 of holes 222, and the entrances are surrounded by the seal groove 264. In such an example, the trajectory of each hole 222 may be arranged to account for the geometry of the plate 202 whereby the recess 208 is absent.

Figure 3C:
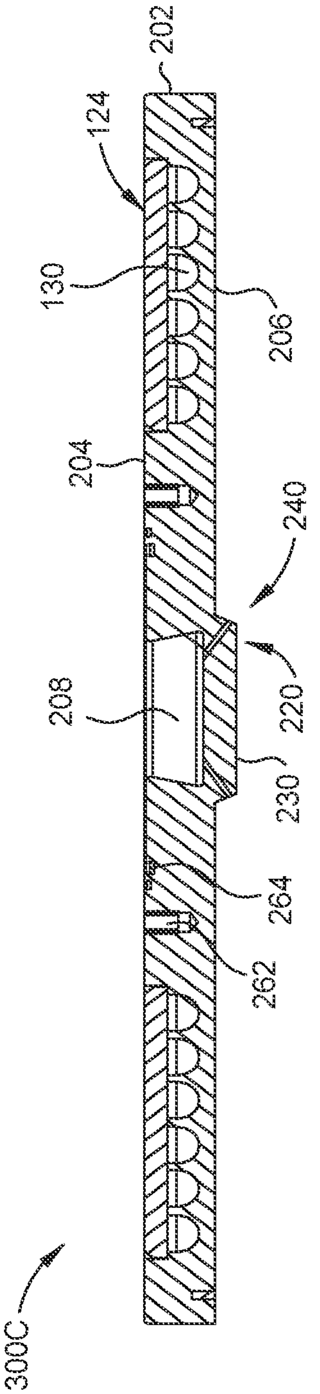

FIG. 3C shows an embodiment of a lid 300C. The lid 300C is similar to the lid 200 of FIG. 2A, and may be used in place thereof. The lid 300C incorporates the one or more openings 262, seal groove 264, recess 208, protrusion 230, and showerhead 240. As illustrated, lid 300C includes a heat exchanger 124 that includes channels 130 formed in the plate 202. The showerhead 240, protrusion 230, and channels 130 are integrated with the plate 202 such that the plate 202 with the showerhead 240, protrusion 230, and the channels 130 is a monolithic, or unitary, structure. As shown, the lower surface 206 of the plate 202 is not shaped or contoured as an interior of a dome. Instead, the lower surface 206 is formed by one or more planar or linear sections.

As a further alternative, it is contemplated that the recess 208 of lid 300C be omitted such that the upper surface 204 of the plate 202 includes the entrance 224 of each hole 222 of the array 220 of holes 222, and the entrances are surrounded by the seal groove 264. In such an example, the trajectory of each hole 222 and/or the geometry of the protrusion 230 may be arranged to account for the geometry of the plate 202 whereby the recess 208 is absent.

Figure 3D:
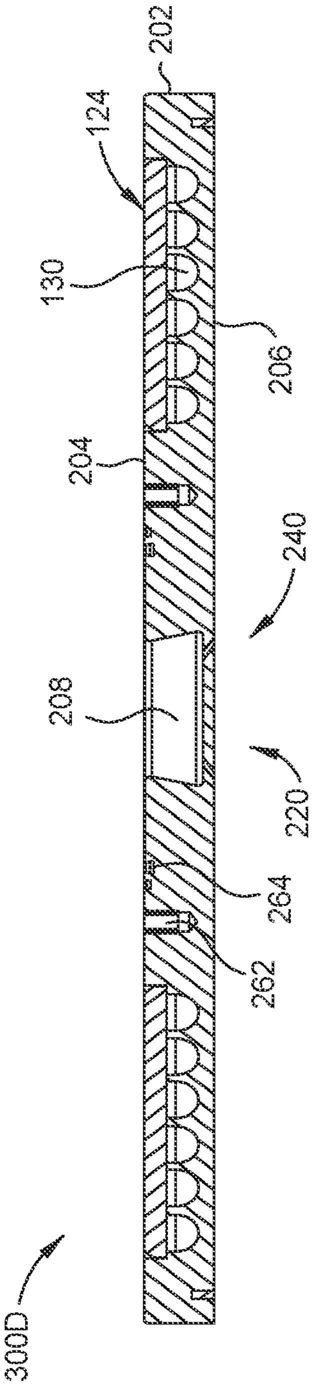

FIG. 3D shows an embodiment of a lid 300D. The lid 300D is similar to the lid 200 of FIG. 2A, and may be used in place thereof. The lid 300D incorporates the one or more openings 262, seal groove 264, recess 208, and showerhead 240. As illustrated, the lid 300B omits the protrusion 230, but includes a heat exchanger 124 that includes channels 130 formed in the plate 202. The showerhead 240 and channels 130 may be integrated with the plate 202 such that the plate 202 with the showerhead 240 and the channels 130 is a monolithic, or unitary, structure. As shown, the lower surface 206 of the plate 202 may not be shaped or contoured as an interior of a dome. Instead, the lower surface 206 of the plate 202 is formed by one or more planar or linear sections.

As a further alternative, it is contemplated that the recess 208 of lid 300D be omitted such that the upper surface 204 of the plate 202 includes the entrance 224 of each hole 222 of the array 220 of holes 222, and the entrances are surrounded by the seal groove 264. In such an example, the trajectory of each hole 222 may be arranged to account for the geometry of the plate 202 whereby the recess 208 is absent.

Figure 4:
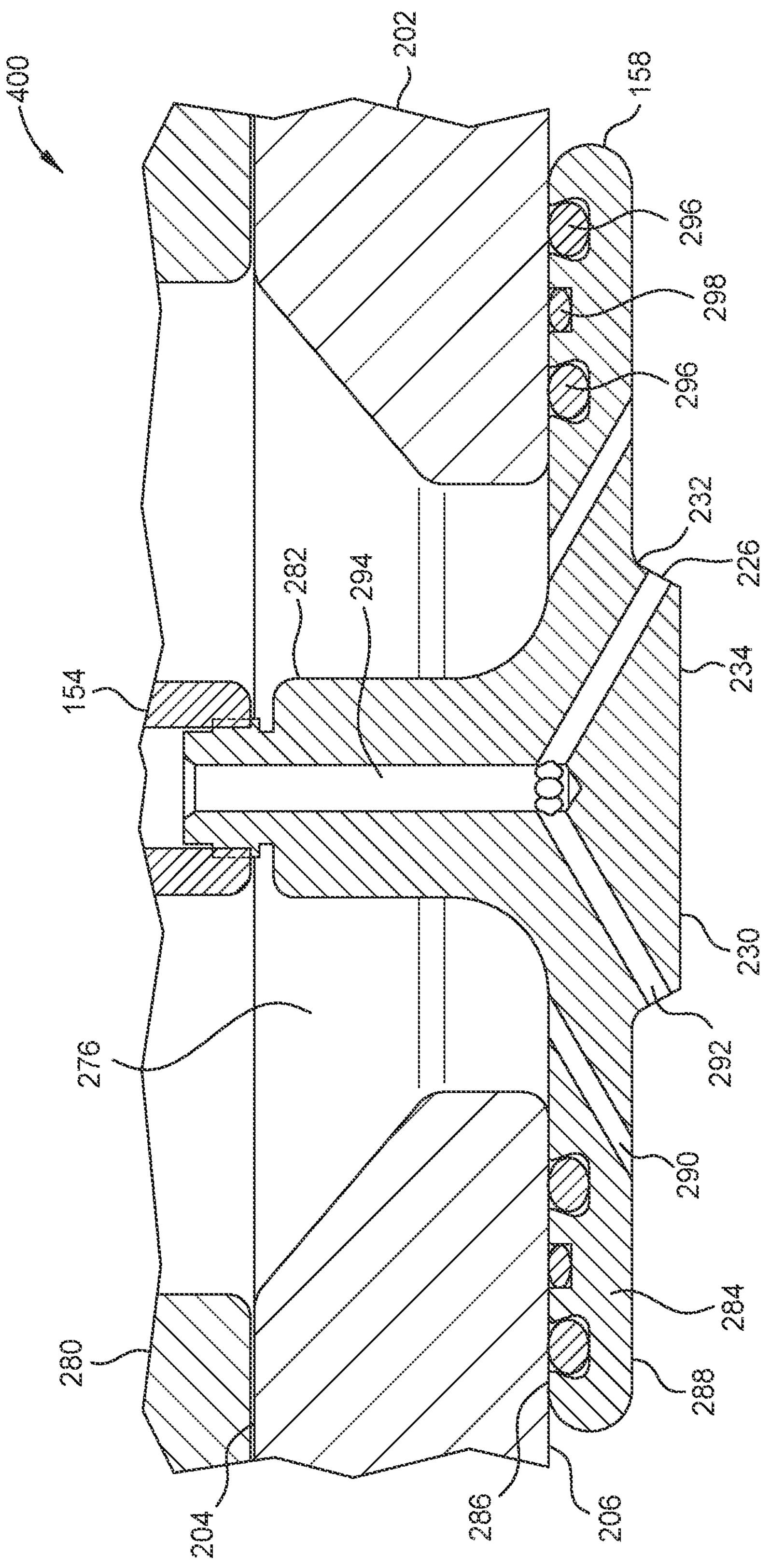
FIG. 4 is a schematic side cross sectional view of a portion of another alternative embodiment of a lid.

FIG. 4 shows an embodiment of a lid 400. The lid 400 is similar to the lid 200 of FIG. 2A, and may be used in place thereof. Lid 400 is shown positioned with a manifold 146 that is coupled to a conduit 150 (as shown in FIG. 1), although it is contemplated that alternatively, the lid 400 may be directly attached to the conduit 150. The lid 400 includes a plate 202 having a port 276 extending from the upper surface 204 of the plate 202 to the lower surface 206 of the plate 202. The manifold 146 is coupled to the upper surface 204 of the plate 202 such that the throughbore 152 of the conduit 150 coupled to the manifold 146 is substantially aligned with the port 276 of the plate 202.

A stem 282 of a baffle 158 is coupled to a bracket 154 of the manifold 146. The baffle 158 includes a disc 284 having an upper side 286 and an opposite lower side 288, and penetrated by outer holes 290 from the upper side 286 to the lower side 288, and through which gas in the conduit 150 and/or in the manifold 140 may flow. The lower side 288 of the disc 284 has a protrusion 230. The baffle 158 has inner holes 292, each of which fluidically couple a central bore 294 to the lower side 288 with an exit 226 at the protrusion 230. As illustrated, the central bore 294 does not extend to the lower side 288 of the disc 284, but terminates within the baffle 158. Alternatively, it is contemplated that the central bore 294 may extend to a central opening at the lower side 288 of the disc 284.

The protrusion 230 is frustoconical in shape having a side face 232 and an end face 234, but other configurations are contemplated. In some embodiments, the protrusion 230 may be shaped like a portion of a sphere, an ellipsoid, or a cylinder. In some embodiments, which may be combined with other embodiments, the exit 226 of each inner hole 292 may be located at the side face 232, or at the end face 234, or at an intersection of the side face 232 and the end face 234. In some embodiments, which may be combined with other embodiments, an exit 226 of one or more inner hole 292 may be located at one of the side face 232, the end face 234, and the intersection of the side face 232 and the end face 234, and an exit 226 of one or more other inner hole 292 may be located at another of the side face 232, the end face 234, and the intersection of the side face 232 and the end face 234. In some embodiments, which may be combined with other embodiments, an angle at which the trajectory of each inner hole 292 whose exit 226 is located at the side face 232 intersects the side face 232 may be substantially 90 degrees.

The upper side 286 of the disc 284 is coupled to the lower surface 206 of the plate 202. One or more seal members 296, such as O-rings, provide a seal at an interface between the upper side 286 of the disc 284 and the lower surface 206 of the plate 202. One or more RF gaskets 298 provide an RF transmission barrier at an interface between the upper side 286 of the disc 284 and the lower surface 206 of the plate 202.

In operation, the process gas flows through the central bore 294 and through the inner holes 292 into the processing volume 160. Additionally, the purge gas flows through the port 276 in the plate 202 and outside the stem 282 of the baffle 158 and through the outer holes 290 into the processing volume 160. In some embodiments, the purge gas flow and the process gas flow are simultaneous, however it is contemplated that the purge gas flow and the process gas flow are not simultaneous. A cleaning cycle of operation involves cleaning gas flowing through the port 276 in the plate 202 and outside the stem 282 of the baffle 158 and through the outer holes 290 into the processing volume 160. In some embodiments, which may be combined with other embodiments, the cleaning gas may become mixed with the purge gas before the combined gases flow through the outer holes 290 into the processing volume 160. In some embodiments, which may be combined with other embodiments, plasma from the remote plasma source 162 may become mixed with the purge gas before the combined plasma and gas flow through the outer holes 290 in the plate 202 into the processing volume 160.

The embodiments of the present disclosure provide a number of benefits for the operation of the processing chamber 100, such as the reduction or elimination of certain undesirable effects. An example undesirable effect concerns the port 276 of the plate 202 providing a path for the RF applied to the processing chamber 100 to traverse through components that are upstream of the lid 200. For example, the RF may traverse through the conduit 150, the remote plasma source 162, and into a feed line leading to the remote plasma source 162 from the source 166 of the cleaning gas. This may lead to the establishment of a standing wave plasma, and thereby may cause deposition within the conduit 150, the remote plasma source 162, and the feed line.

Another undesirable effect mitigated by the embodiments of the present disclosure concerns the low operation pressure of the processing volume 160 and low gas velocities through the port 276 giving rise to back diffusion of radicals into the conduit 150, the remote plasma source 162, and the feed line. Such back diffusion of radicals may cause or contribute to deposition within the conduit 150, the remote plasma source 162, and the feed line.

Further still, the above undesirable effects may impact operation of the processing chamber 100 to the extent of causing stray depositions inside the processing volume 160, such as on the lid 200, the spacer 110, and even on the substrate 118 and on films deposited on the substrate 118. Such stray depositions may result in defects in a substrate 118 and in films deposited on the substrate 118.

The arrangement of the showerhead 240 and the plate 202, particularly in embodiments in which the showerhead 240 is integral with the plate 202, may facilitate the entire enclosure of processing volume 160 (including plate 202, riser 105 (when present), and spacer 110) being fully grounded during use, thereby inhibiting the generation of parasitic plasma. The arrangement of the baffle 158 with an RF gasket 298 as shown in FIG. 4 may also facilitate the entire enclosure of processing volume 160 (including plate 202, riser 105 (when present), and spacer 110) being fully grounded during use, thereby inhibiting the generation of parasitic plasma. Thus, the embodiments of the present disclosure may inhibit unwanted RF traversal upstream, thereby hindering the creation of standing wave plasma and deterring parasitic deposition.

Additionally, the embodiments of the present disclosure may promote a velocity of the gas entering the processing volume 160 through the lid 200, 300A, 300B, 300C, 300D, or 400 to be of a magnitude sufficient to inhibit back diffusion of radicals. Thus, the embodiments of the present disclosure may deter upstream stray depositions. Furthermore, the velocity of the gas entering the processing volume 160 through the lid 200, 300A, 300B, 300C, 300D, or 400 may be of a magnitude sufficient to inhibit stray deposition within the processing volume 160, thereby reducing the incidence and magnitude of defects in a substrate 118 and in films deposited on the substrate 118.

While the foregoing is directed to embodiments of the present disclosure, other and further embodiments of the disclosure may be devised without departing from the basic scope thereof, and the scope thereof is determined by the claims that follow.

What is claimed is:

1. A lid for a process chamber, the lid comprising:

a plate having a first surface and a second surface opposite the first surface, the plate including an axis generally perpendicular to the first surface;

a recess in the first surface, the recess including a sidewall extending at a first acute angle to the axis from an opening at the first surface to a floor within the plate;

a seal groove formed in the first surface and surrounding the opening; and an array of holes, each hole extending at a second acute angle to the axis from an entrance at the floor of the recess to an exit at a protrusion of the second surface, the protrusion aligned with the recess.

2. The lid of claim 1, wherein a cross sectional area of the opening is less than a cross sectional area of the floor.

3. The lid of claim 1, wherein the array of holes is arranged as:

a first ring of circumferentially-spaced first holes, each first hole having a first entrance at the floor of the recess and a first exit at the protrusion;

a second ring of circumferentially-spaced second holes, each second hole having a second entrance at the floor of the recess and a second exit at the protrusion; and wherein:

the first ring has a first radius measured from the axis to the first entrance of each first hole, the second ring has a second radius measured from the axis to the second entrance of each second hole, and the second radius is greater than the first radius.

4. The lid of claim 3, wherein:

the first ring has a third radius measured from the axis to the first exit of each first hole, the second ring has a fourth radius measured from the axis to the second exit of each second hole, and the fourth radius is greater than the third radius.

5. The lid of claim 1, wherein the second surface at least partially defines a dome.

6. The lid of claim 1, further comprising channels in the first surface, the channels configured to convey a heat exchange fluid.

7. The lid of claim 1, wherein the protrusion is frustoconical.

8. The lid of claim 7, wherein:

the protrusion includes a side face and an end face; and the exit of each hole is at the side face.

9. A lid for a process chamber, the lid comprising:

a plate having a first surface and a second surface opposite the first surface, the first and second surfaces extending laterally to an outer edge of the plate, and the plate including an axis generally perpendicular to the first surface; a recess in the first surface, the recess including a sidewall extending at a first acute angle to the axis from an opening at the first surface to a floor within the plate; a seal groove formed in the first surface; and a showerhead comprising an array of holes extending through the plate, each hole of the array of holes extending at a second acute angle to the axis from an entrance at the floor of the recess to an exit at a protrusion of the second surface, the entrance located radially inward of the seal groove, wherein a maximum radial extent of the showerhead from the axis is 30% or less of a maximum lateral extent of the second surface from the axis.

10. The lid of claim 9, wherein the array of holes is arranged as:

a first ring of circumferentially-spaced first holes, each first hole having a first entrance at the floor of the recess and a first exit at the second surface;

a second ring of circumferentially-spaced second holes, each second hole having a second entrance at the floor of the recess and a second exit at the second surface; and wherein:

the first ring is centered on the axis and has a first radius measured from the axis to the first entrance of each first hole, the second ring is centered on the axis and has a second radius measured from the axis to the second entrance of each second hole, and the second radius is greater than the first radius.

11. The lid of claim 10, wherein:

the first ring has a third radius measured from the axis to the first exit of each first hole, the second ring has a fourth radius measured from the axis to the second exit of each second hole, and the fourth radius is greater than the third radius.

12. The lid of claim 11, wherein the plate and showerhead are formed as a unitary structure.

13. The lid of claim 9, wherein the second surface at least partially defines a dome.

14. The lid of claim 9, wherein the protrusion is frusto-conical.

15. The lid of claim 14, wherein:

the protrusion includes a side face and an end face; and the exit of each hole is at the side face.

16. An assembly, comprising:

a conduit configured to connect to a first gas source; and a lid including:

a plate having:

a first surface connected to the conduit by a plurality of fixtures including apertures in the first surface or projections from the first surface;

a seal at an interface between the plate and the conduit;

a second surface opposite the first surface;

a recess in the first surface, the recess radially inward of the seal and centered on an axis that is generally perpendicular to the first surface, wherein the recess includes a sidewall extending at a first acute angle to the axis from an opening at the first surface to a floor within the plate; and a showerhead aligned with the recess and the conduit along the axis, and comprising an array of holes extending at a second acute angle to the axis through the plate from an entrance at the floor of the recess to an exit at a protrusion of the second surface.

17. The lid of claim 16, wherein the protrusion is frusto-conical.

18. The lid of claim 17, wherein:

the protrusion includes a side face and an end face; and the exit of each hole is at the side face.

* * * * *